US010408602B2

(12) United States Patent
Efraty et al.

(10) Patent No.: US 10,408,602 B2
(45) Date of Patent: Sep. 10, 2019

(54) QUALITY ESTIMATION AND IMPROVEMENT OF IMAGING METROLOGY TARGETS

(71) Applicant: KLA-Tencor Corporation, Milpitas, CA (US)

(72) Inventors: Boris Efraty, Carmiel (IL); Yuri Paskover, Caesarea (IL)

(73) Assignee: KLA-Tencor Corporation, Milpitas, CA (US)

(*) Notice: Subject to any disclaimer, the term of this patent is extended or adjusted under 35 U.S.C. 154(b) by 247 days.

(21) Appl. No.: 15/131,728

(22) Filed: Apr. 18, 2016

(65) Prior Publication Data
US 2016/0231102 A1 Aug. 11, 2016

Related U.S. Application Data

(63) Continuation of application No. PCT/US2015/057449, filed on Oct. 27, 2015.

(60) Provisional application No. 62/069,096, filed on Oct. 27, 2014.

(51) Int. Cl.
G01B 11/00 (2006.01)
G03F 7/20 (2006.01)

(52) U.S. Cl.
CPC .......... G01B 11/00 (2013.01); G03F 7/70633 (2013.01)

(58) Field of Classification Search
CPC ..... G01B 11/00; G03F 7/70633; G03F 7/705; G03F 7/70516; G01N 21/9501; G01N 21/95607
See application file for complete search history.

(56) References Cited

U.S. PATENT DOCUMENTS

| 6,985,618 | B2 | 1/2006 | Adel et al. |
| 7,415,386 | B2 | 8/2008 | Burch et al. |
| 7,456,975 | B2 | 11/2008 | De Groot |
| 2004/0040003 | A1* | 2/2004 | Seligson ............ G03F 7/705 382/151 |
| 2006/0193507 | A1 | 8/2006 | Sali et al. |

(Continued)

FOREIGN PATENT DOCUMENTS

| WO | WO2006/125131 | 11/2006 |
| WO | WO2014/074893 | 5/2014 |

OTHER PUBLICATIONS

Adel, M., et al. "Optimized Overlay Metrology Marks: Theory and Experiment," Computer Science Dept. Technion, Haifa, Israel, Dec. 1, 2014, pp. 1-30.

(Continued)

Primary Examiner — Manuel L Barbee
(74) Attorney, Agent, or Firm — Suiter Swantz pc llo

(57) ABSTRACT

Methods are provided, which estimate a quality of a metrology target by calculating a noise metric of its ROI kernels, derived from application of a Fourier filter on the measured kernel with respect to a periodicity of the target's periodic structure(s); and using the calculated noise metric to indicate the target quality. An additional Fourier filter may be applied perpendicularly on the measured kernel with respect to a periodicity of a perpendicular segmentation of the periodic structure(s), and the (2D) noise metric may be derived by application of both Fourier filters. The estimated noise may be analyzed statistically to provide various types of information on the target.

10 Claims, 7 Drawing Sheets

(56) References Cited

U.S. PATENT DOCUMENTS

2010/0092102 A1 4/2010 Sun
2014/0136137 A1 5/2014 Tarshish-Shapir et al.

OTHER PUBLICATIONS

Seligson, Joel, et al. "Target Noise in Overlay metrology," Proceedings of SPIE vol. 5375, SPIE, Bellingham, WA, 2004, http://www.spiedl.org/ on Nov. 27, 2014.

* cited by examiner

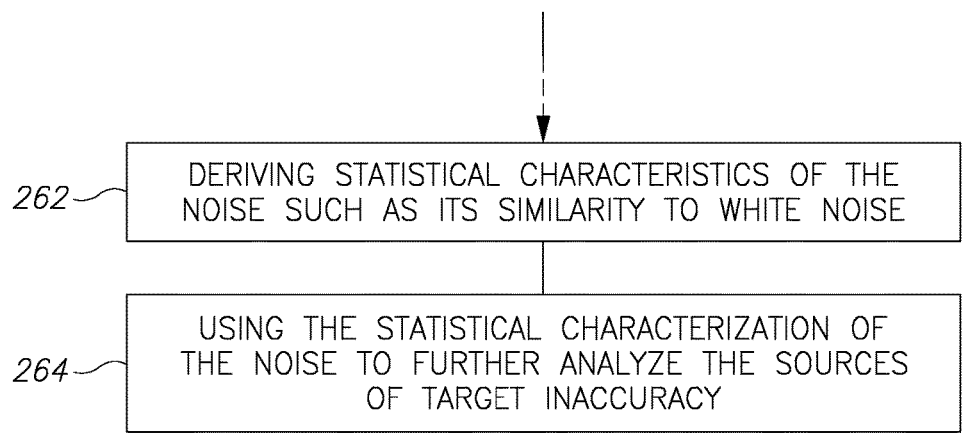
Figure 7 (cont. 1)

QUALITY ESTIMATION AND IMPROVEMENT OF IMAGING METROLOGY TARGETS

CROSS REFERENCE TO RELATED APPLICATIONS

This application is filed under 35 U.S.C. § 111(a) and § 365(c) as a continuation of International Patent Application Serial No. PCT/US2015/057449, filed Oct. 27, 2015 which application claims the benefit of U.S. Provisional Patent Application No. 62/069,096, filed Oct. 27, 2014, which applications are incorporated herein by reference in their entirety.

BACKGROUND OF THE INVENTION

1. Technical Field

The present invention relates to the field of metrology, and more particularly, to accuracy estimation and improvement in imaging overlay targets.

2. Discussion of Related Art

FIG. 1 is a schematic illustration of an overlay target 90, comprising multiple periodic structures and a derivation of its center of symmetry, according to the prior art. The illustrated target comprises periodic structures at a previous (lower) layer and at a current (upper) layer, for which the centers of symmetry are derived by defining respective regions of interest (ROIs) 91, 92 in the optical image of the periodic structures and deriving kernels (projections, or intensity graphs, illustrated schematically within ROIs 91, 92) which are analyzed in pairs to determine their respective centers of symmetry of each layer, using the convolution expressed in Equation 1, with $K^L$ and $K^R$ representing the kernels in the pair:

$$\int dx \left( K^L\left(x - \frac{\delta}{2}\right) \times K^R\left(\frac{\delta}{2} - x\right) \right) \quad \text{Equation 1}$$

The quality of the target itself is currently assessed manually, e.g., inspected by eye, or indirectly through its impact on the measurement accuracy, using metrological accuracy merits.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising estimating a quality of a metrology target comprising at least one periodic structure by calculating a noise metric of at least one corresponding ROI kernel, derived from application of a Fourier filter on the measured kernel with respect to a periodicity of the at least one periodic structure; and using the calculated noise metric to indicate the target quality.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 2:
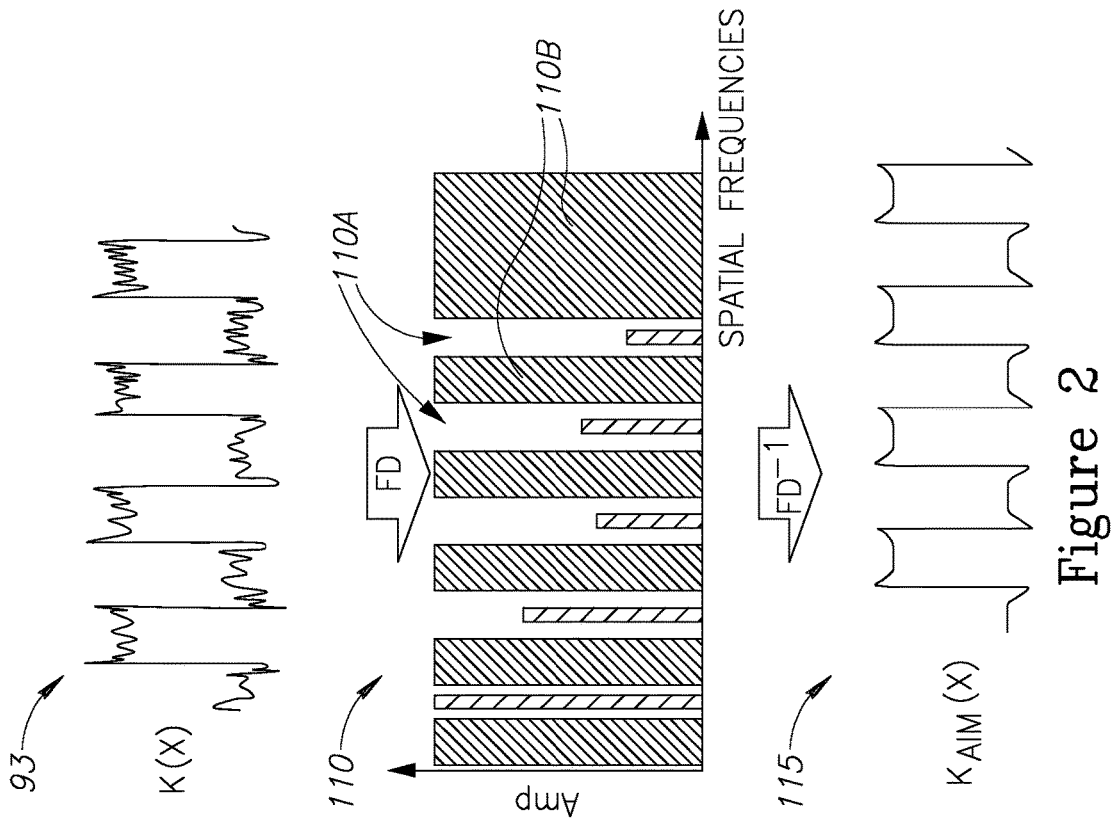
FIG. 2 is a high level schematic illustration of estimation of target quality and removal of noise from a kernel signal, according to some embodiments of the invention.
Figure 1:
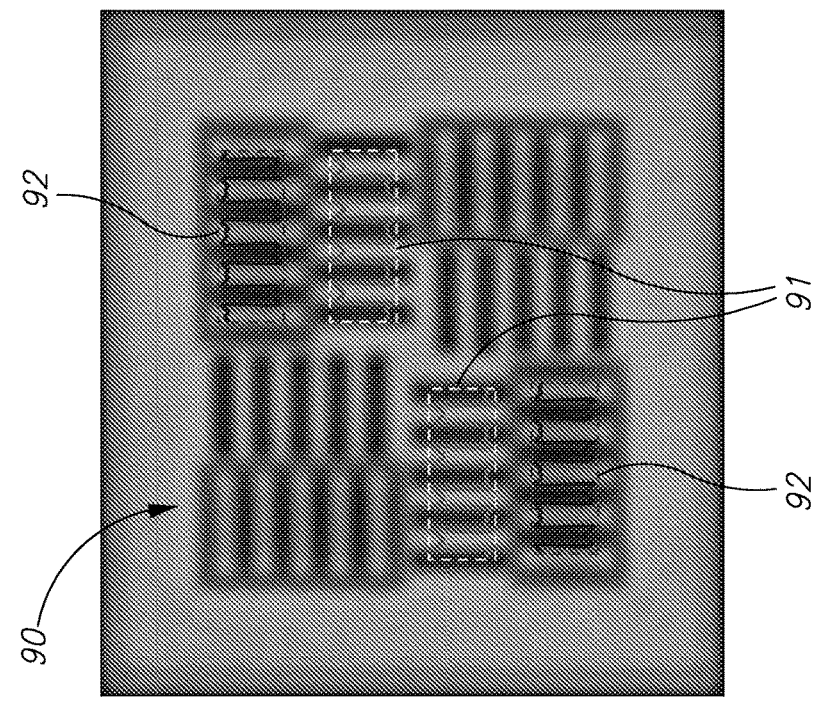
FIG. 1 is a schematic illustration of an overlay target, comprising multiple periodic structures and a derivation of its center of symmetry, according to the prior art.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways. Also, it is to be understood that the phraseology and terminology employed herein is for the purpose of description and should not be regarded as limiting.

Methods are provided, which estimate a quality of a metrology target by calculating a noise metric of its ROI kernels, derived from application of a Fourier filter on the measured kernel with respect to a periodicity of the target's periodic structure(s); and using the calculated noise metric to indicate the target quality. An additional Fourier filter may be applied perpendicularly on the measured kernel with respect to a periodicity of a perpendicular segmentation of the periodic structure(s), and the (2D) noise metric may be derived by application of both Fourier filters. The estimated noise may be analyzed statistically to provide various types of information on the target.

FIG. 2 is a high level schematic illustration of estimation of target quality and removal of noise from a kernel signal 93, according to some embodiments of the invention. Target noise, defined as signals that diverge from the designed target periodicities (i.e., base spatial frequency and its harmonics), may be evaluated and removed by using a Fourier filter 110 (FD denotes the transfer to the Fourier spatial frequency domain, $FD^{-1}$ denotes the return to the spatial domain) that separates kernel signal at the designed target frequencies from kernel signal at frequencies other than the designed target (i.e., noise frequencies). The dark regions (110B) in Fourier filter 110 represent the noise frequencies, the signal in which may be used to evaluate target noise, and be removed from kernel signal 93, and the lines (110A) in Fourier filter 110 represent the designed target frequencies (base frequency and its harmonics). By applying the reverse Fourier transform on the designed target frequencies only, a cleaned kernel signal 115 is derived. FIG. 2 thus demonstrates an estimation a quality of metrology target 90 (comprising at least one periodic structure) by calculating a noise metric of ROI kernels, derived from application of Fourier filter 100 on measured kernels 93 with respect to a periodicity of the periodic structure(s), and using the calculated noise metric to indicate the target quality.

In the following, an exemplary algorithm is provided to yield noise estimation in the target and noise removal from the measured kernels. Initial algorithms have shown noise reduction of ca. 95% from the measured signals. The expected target kernel signal $K_{AIM}$ may be expressed as in Equation 2, expressing the target's spatial frequencies in terms of the pitch P of the corresponding periodic structure and coefficients $A_n$, $\Phi_n$ relating to each frequency:

$$K_{AIM}(x) = \sum_n A_n \cos\left(\frac{2\pi n}{P} x + \phi_n\right) \qquad \text{Equation 2}$$

A least squares fit procedure may then be used to determine the amplitudes $A_n$ and the phases $\Phi_n$ of the pitch harmonics (target's spatial frequencies) to build clean kernel 115, by minimizing the distance between measured signal 93 and the expression of Equation 2, i.e., solving the expression formulated in Equation 3:

$$\operatorname{argmin}_{\{A_n;\phi_n\}} \int dx (K(x) - K_{AIM}(x))^2 \qquad \text{Equation 3}$$

Then, cleaned kernels 115, $K_{AIM}^L$ and $K_{AIM}^R$ with calculated coefficients $A_n$, $\Phi_n$, rather than measured kernels 93, may be used to find analytically the maximum convolution position, as expressed in Equation 4:

$$\operatorname{argmax}_\delta \int dx\, K_{AIM}^L(x) \times K_{AIM}^R(\delta - x) \qquad \text{Equation 4}$$

The difference between the centers of symmetry of the layers then defines the overlay, and the calculated noise metrics such as $K-K_{AIM}$ or noise to signal ratios (e.g., $(K-K_{AIM})/K$, ratio of standard deviations as presented below, etc.) may be used to evaluate the target quality.

Figure 3:
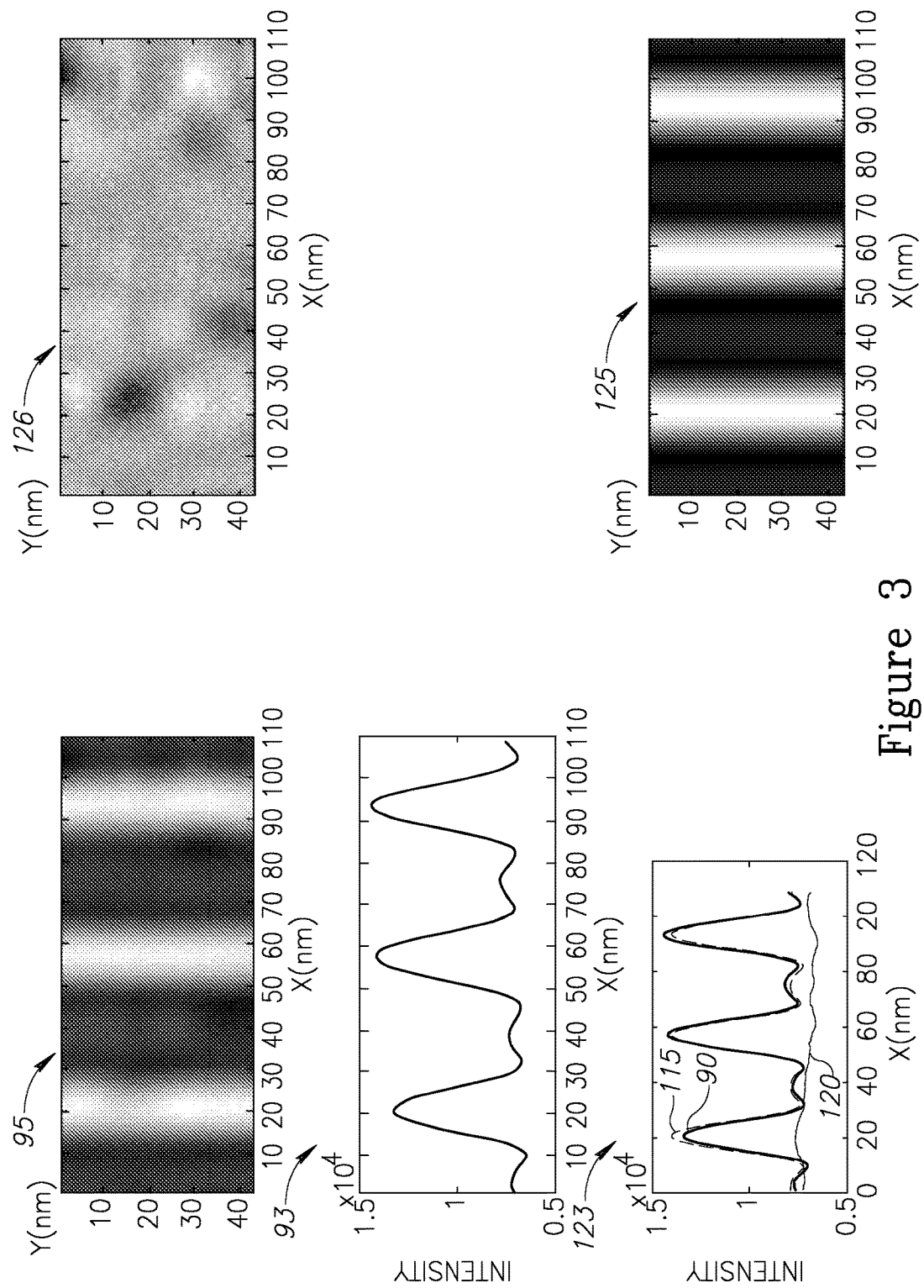
FIG. 3 is a high level schematic illustration of a derivation of the target noise and of the cleaned signal in one spatial dimension (1D), according to some embodiments of the invention.

FIG. 3 is a high level schematic illustration of a derivation of the target noise and of the cleaned signal in one spatial dimension (1D), according to some embodiments of the invention. FIG. 3 depicts an imaged ROI 95, its measured kernel 93 and a diagram 123 illustrating measured kernel 90, cleaned signal 115 and residual noise signal 120 ($K-K_{AIM}$), used to derive a noise metric NSR, as calculated according to Equation 5, with Kernel=Kernel_AIM+Kernel_residual:

$$NSR_{Kernel} = \frac{\text{Noise}}{\text{signal}} \approx \frac{\text{std}(\text{Kernel\_residual})}{\text{std}(\text{Kernel})} \qquad \text{Equation 5}$$

FIG. 3 also provides a visual representation of the clean signal and the noise—imaged ROI 125 represents cleaned signal 115 ($K_{AIM}$) and image 126 represents residual noise signal 120 ($K-K_{AIM}$).

Figure 4:
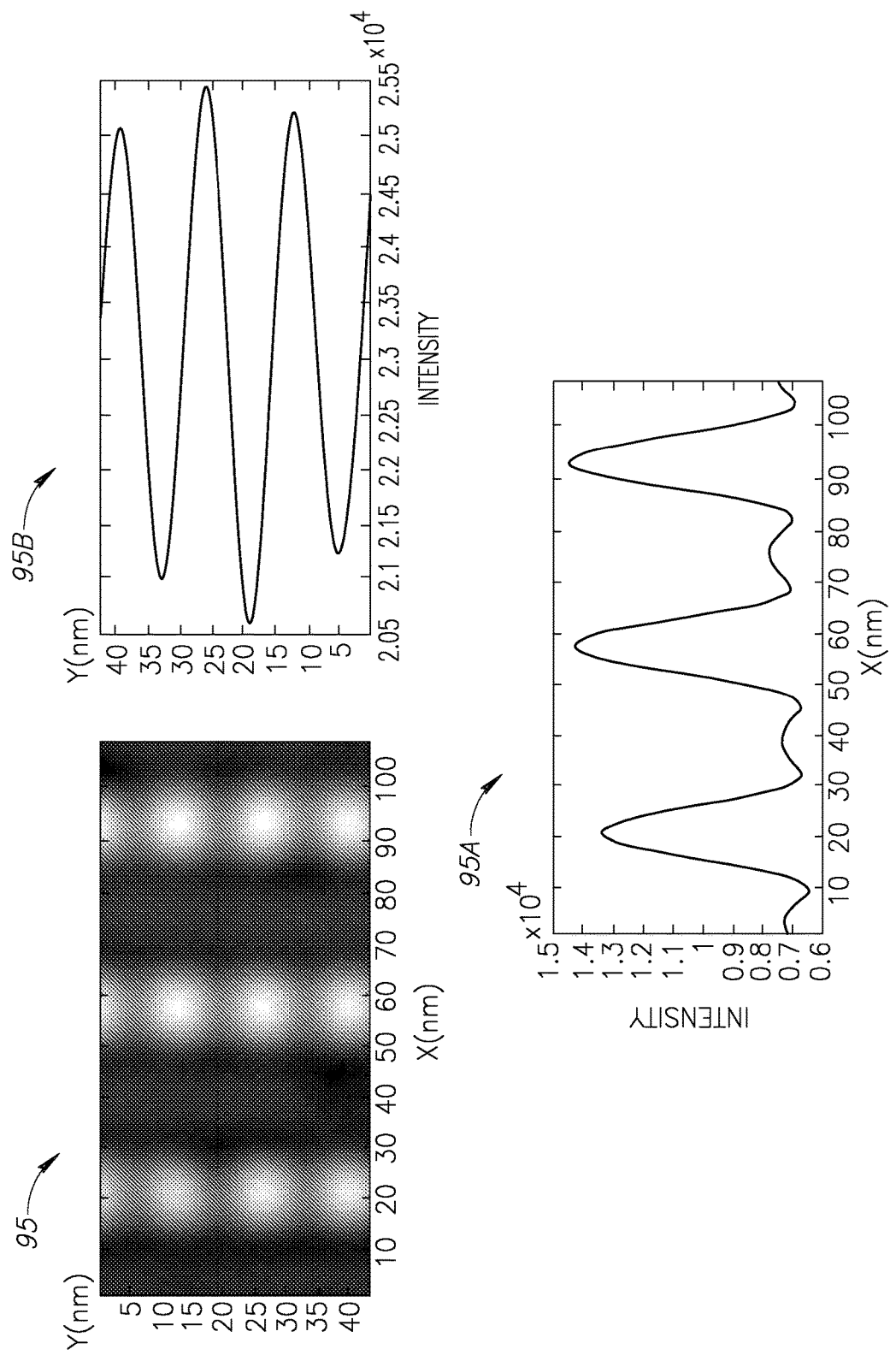
FIG. 4 is a high level schematic illustration of an ROI image of a target that is designed to have specified spatial frequencies along two dimension (2D), and corresponding kernel signals), according to some embodiments of the invention.

FIG. 4 is a high level schematic illustration of ROI image 95 of a target that is designed to have specified spatial frequencies along two dimension (2D), and corresponding kernel signals 95A, 95B, according to some embodiments of the invention. For example, the perpendicular periodicity may be due to secondary segmentation introduced to overcome process variation effects such as CMP (Chemical Mechanical Planarization).

Figure 5:
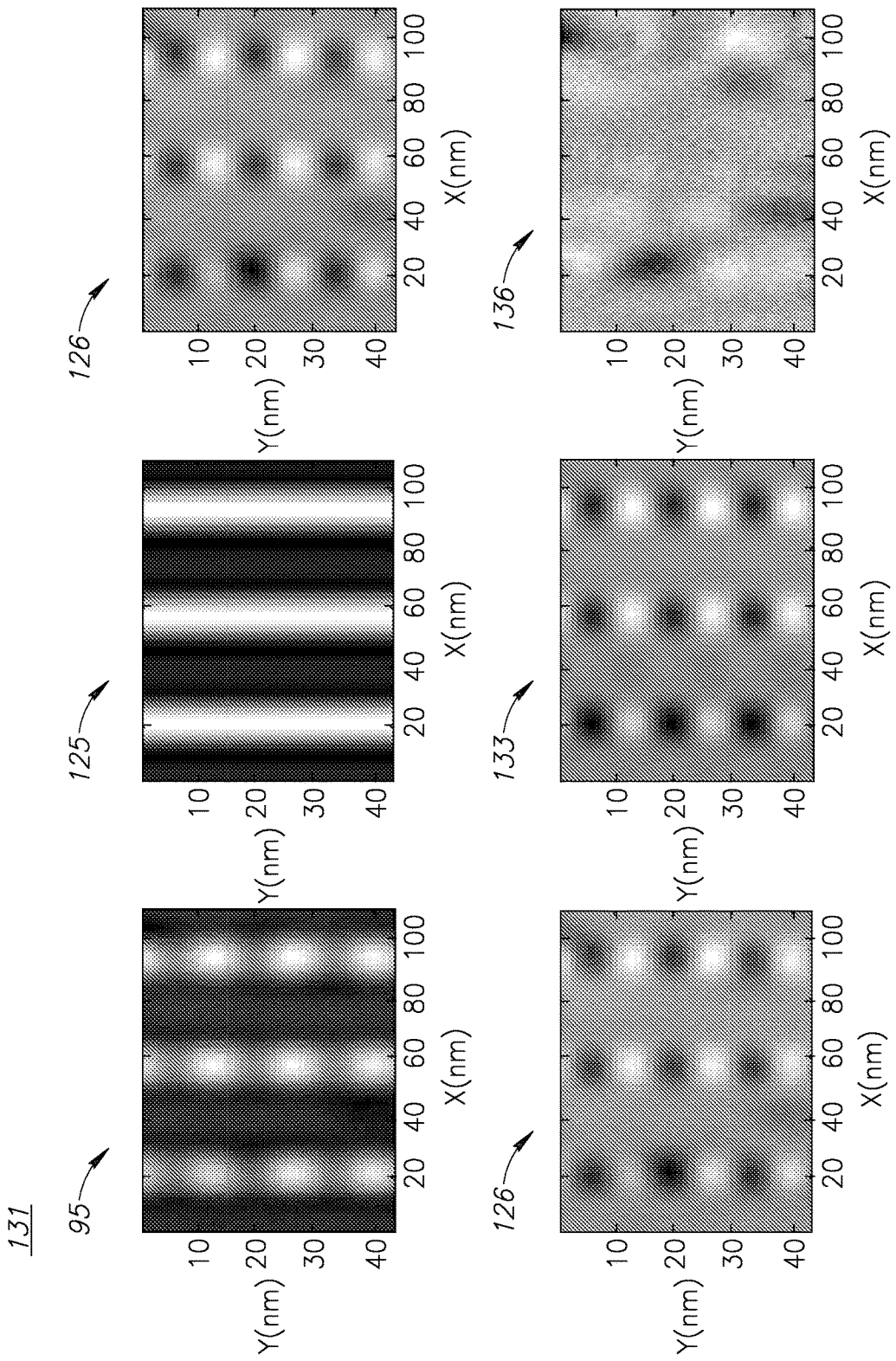
FIG. 5 is a high level schematic illustration of a derivation of the target noise and of the cleaned signal in two spatial dimensions (2D), according to some embodiments of the invention.

FIG. 5 is a high level schematic illustration of a derivation 131 of the target noise and of the cleaned signal in two spatial dimensions (2D), according to some embodiments of the invention. FIG. 5 depicts imaged ROI 95, and visual representations of clean signal 125 and noise 126 that is removed after application of the method along one (the horizontal) axis (top row pf images).

The bottom row of images illustrates visual representation of noise 126, a clean signal 133 derived in the perpendicular (in the illustrated case, the vertical) direction and residual noise 136, after the 2D analysis. A comparison of residual noise patterns 126, 136 indicates that a large part of the noise detected in the 1D analysis is attributed to the vertical segmentation, and thus may be used both to estimate the noise in the vertical segmentation with respect to the designed pattern (see FIG. 4) as well as to derive a noise metric for the perpendicular segmentation.

The suggested method may thus comprise applying an additional Fourier filter perpendicularly on the measured kernel with respect to a periodicity of a perpendicular segmentation of the target's periodic structure(s), and deriving the noise metric by application of both Fourier filters.

The Fourier filters may be applied sequentially, e.g., the vertical filter may be applied to the horizontally cleaned signal $K_{AIM}$ (derived according to Equation 3) and use the same procedures (Equations 2-4) to derive the 2D cleaned signal and the 2D residual noise. Alternatively or complementarily, 1 2D Fourier filter may be applied to the kernel signal to derive the noise in both directions and/or the respective noise components $ROI_{AIM}$ (denoting the cleaned ROI signal due to the target, the direction of the target's periodicity) and $ROI_{CMP}$ (denoting the cleaned ROI signal along the elements of the target's periodic structure, due to the segmentation along the perpendicular direction to the target's periodicity), with the relations and definitions expressed in Equations 6:

$$\text{Noise} = ROI_{residual} = ROI_{measured} - ROI_{AIM} - ROI_{CMP} \qquad \text{Equations 6}$$

$$NSR_{ROI} = \frac{\text{std}(ROI_{residual})}{\text{std}(ROI)}$$

It is noted that in case the segmentation pitch (i.e., the pitch in the direction perpendicular to the target's periodicity) is not known, Equation 3 may be modified into Equation 7 in deriving $ROI_{CMP}$ with respect to the derivation of the clean signal in the perpendicular direction:

$$\operatorname{argmin}_{\{A_n;\phi_n;P\}} \int dx (K(x) - K_{AIM}(x))^2 \qquad \text{Equation 7}$$

The difference between the 1D noise estimation and the 2D noise estimation may be used to derive additional target characteristics as well as to refine the inaccuracy estimation and to enhance recipe optimization, process control and flyers (outliers) detection.

In certain embodiments, the noise metric may be a more sophisticated statistical descriptor and/or statistics used for hypothesis tests with respect to the target's quality. For example, a noise metric KS-NROI may be defined as a Kolmogorov-Smirnov statistics used to verify how far the additive noise is from white noise.

Figure 6:
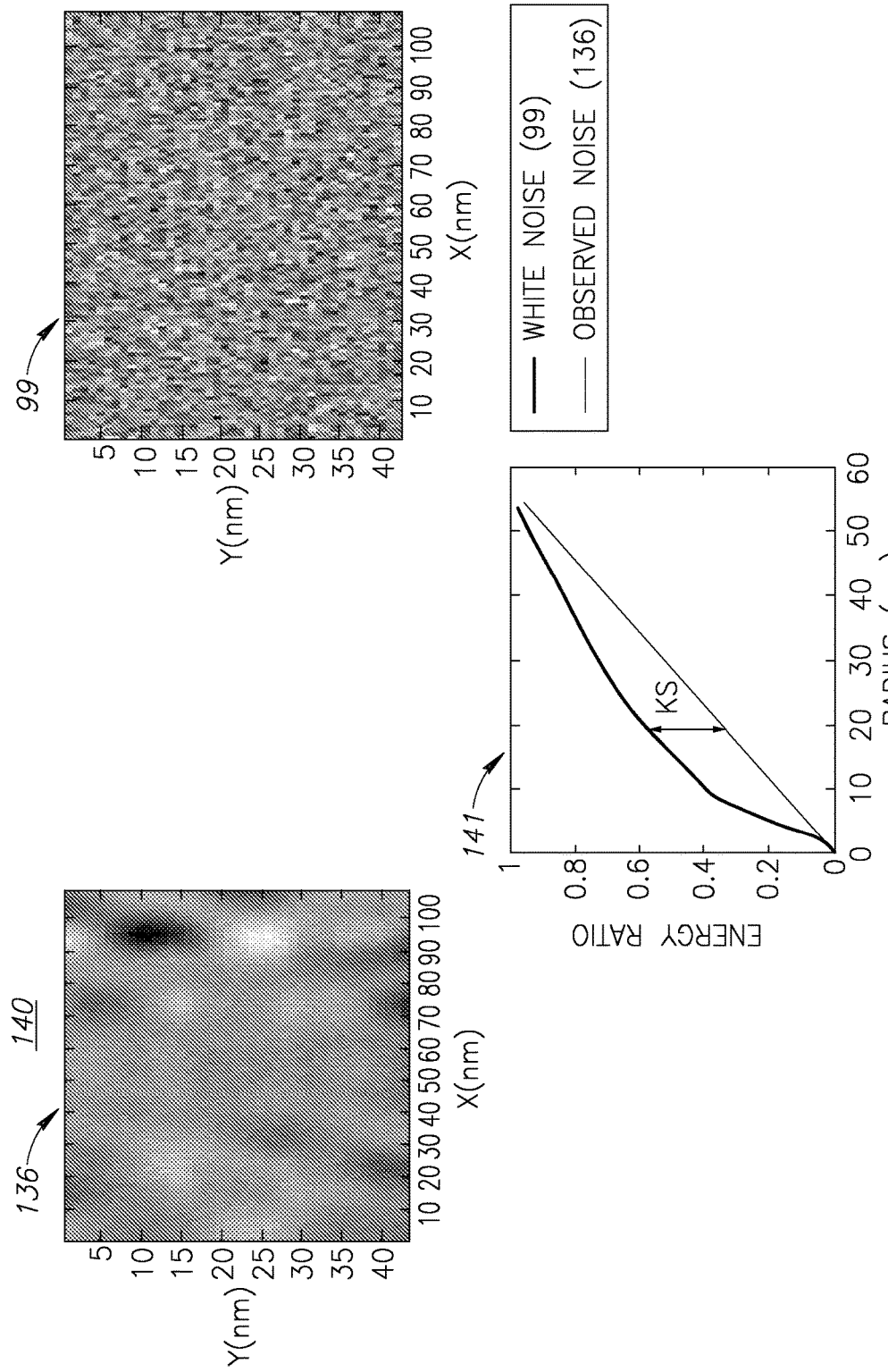
FIG. 6 is a high level schematic illustration of noise analysis, according to some embodiments of the invention.

FIG. 6 is a high level schematic illustration of noise analysis 140, according to some embodiments of the invention. Kolmogorov-Smirnov statistics may be used to construct the cumulative distribution function that estimates the concentration of signal energy as a function of radius around the center of coordinates in the frequency space. The KS noise metric, illustrated graphically in diagram 141, may be derived by comparing residual noise 136 with white noise 99. It is noted that the Fourier transform of white noise is white noise, and that the values of the KS energy ratios are between 0 (denoting white noise) and 1 (denoting a uniform signal). Other statistical tests may be used to characterize the residual noise pattern (e.g., Fisher's Kappa etc.).

Figure 7:
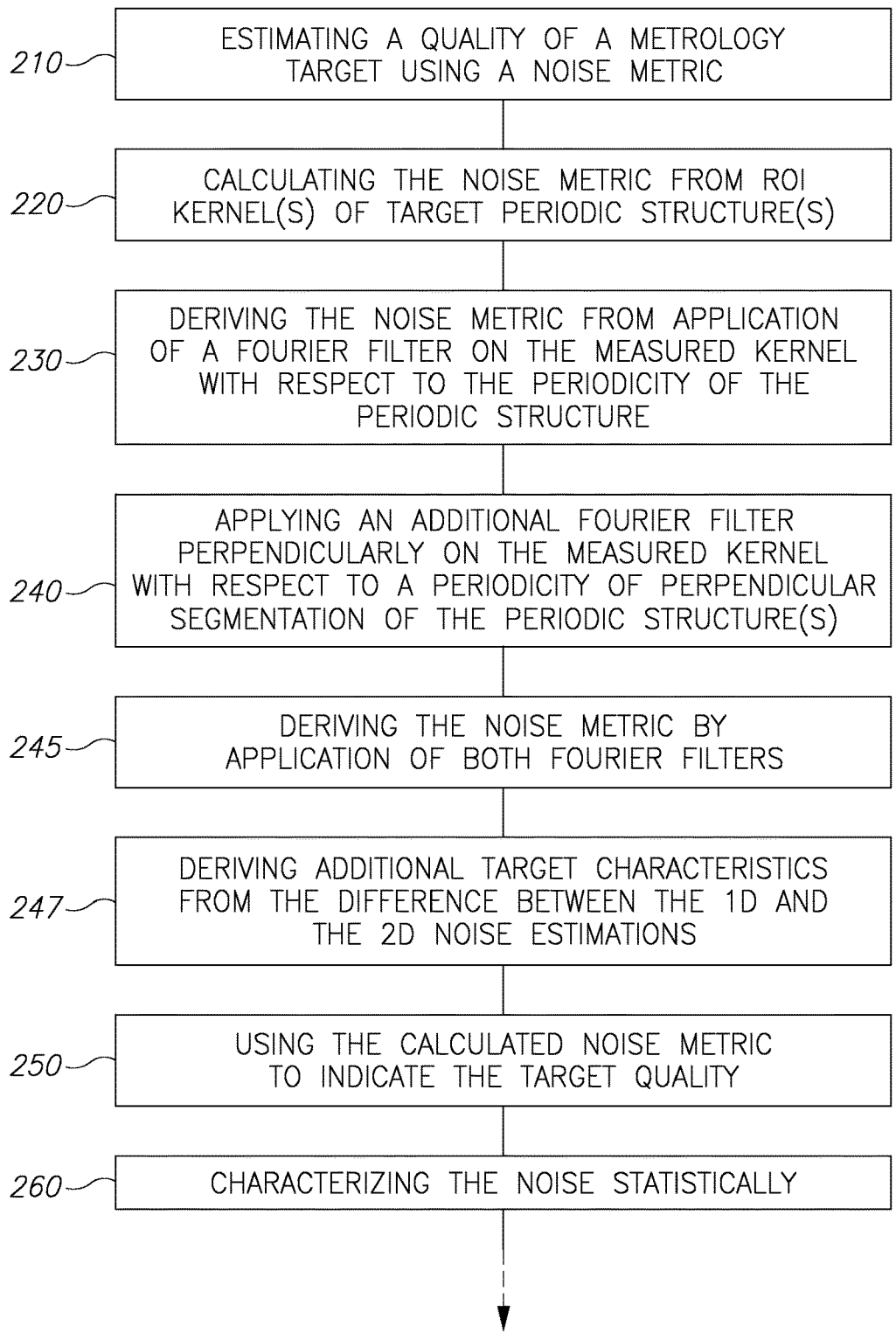
FIG. 7 is a high level flowchart illustrating a method, according to some embodiments of the invention.

FIG. 7 is a high level flowchart illustrating a method 200, according to some embodiments of the invention. Method 200 may be at least partially implemented by at least one computer processor, e.g., in a metrology module. Certain embodiments comprise computer program products comprising a computer readable storage medium having computer readable program embodied therewith and configured to carry out of the relevant stages of method 200.

Method 200 may comprise estimating a quality of a metrology target comprising at least one periodic structure using a noise metric (stage 210), for example by calculating a noise metric of at least one corresponding ROI kernel (stage 220), derived from application of a Fourier filter on the measured kernel with respect to a periodicity of the at least one periodic structure (stage 230). Method 200 may further comprise using the calculated noise metric to indicate the target quality (stage 250).

Method 200 may further comprise applying an additional Fourier filter perpendicularly on the measured kernel with respect to a periodicity of a perpendicular segmentation of the at least one periodic structure (stage 240), and deriving the noise metric by application of both Fourier filters (stage 245). In certain embodiments, a difference between the 1D noise estimation and the 2D noise estimation may be used to derive additional target characteristics (stage 247). It is noted that the 1D noise estimation may be derived by application of any one of the Fourier filters, while the 2D noise estimation may be derived by application of both of the Fourier filters.

Method 200 may further comprise characterizing the residual noise statistically (stage 260), e.g., by deriving statistical characteristics of the noise such as similarity to white noise (stage 262) and using the characterization to further analyze the sources of target inaccuracy (stage 264).

Advantageously, the proposed methods provide estimations of noise in 1D and in 2D. Moreover, the difference between them may be used for inaccuracy estimation, recipe optimization, process control and flyers detection. Derived metrics (such as KS statistics) may be used for hypothesis tests of noise distribution. The proposed methods are applicable to any imaging overlay targets (e.g., AIM—advanced imaging metrology and Box-in-Box targets) and the estimation is advantageously based on target design assumptions and does not depend on the noise type. The noise signature estimations, in 1D and/or in 2D, may be performed in Autorun, Train and/or Recipe Optimization stages as well as in off-line analysis of measured results.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of estimating a quality of a metrology target including at least one periodic structure, comprising:
   acquiring one or more optical images of the at least one periodic structure of the metrology target;
   applying, with a processor, a first Fourier filter on a measured kernel with respect to a periodicity of the at least one periodic structure;
   applying, with the processor, a second Fourier filter perpendicularly on the measured kernel with respect to a periodicity of a perpendicular segmentation of the at least one periodic structure;
   determining, with the processor, a noise metric of at least one region of interest kernel based on the application of the first Fourier filter and the second Fourier filter; and
   adjusting one or more process control conditions based on the noise metric.

2. The method of claim 1, further comprising:
   deriving, with the processor, one or more statistical characteristics of residual noise; and,
   analyzing, with the processor, one or more sources of target inaccuracy with the one or more statistical characteristics.

3. The method of claim 1, further comprising:
deriving, with the processor, one or more additional target characteristics from a difference between a ID noise estimation and a 2D noise estimation, wherein:
the ID noise estimation is derived by application of one of the first or second Fourier filters; and,
the 2D noise estimation is derived by application of both of the first and second Fourier filters.

4. The method of claim 1, wherein the metrology target comprises:
an advanced imaging metrology (AIM) target.

5. The method of claim 1, wherein the metrology target comprises:
a box-in-box target.

6. A system for estimating a quality of a metrology target including at least one periodic structure, comprising:
a non-transitory computer readable storage medium embodying a computer readable program; and,
a processor configured to read the computer readable program to:
acquire one or more optical images of the at least one periodic structure of the metrology target;
apply a first Fourier filter on a measured kernel with respect to a periodicity of the at least one periodic structure;
apply a second Fourier filter perpendicularly on the measured kernel with respect to a periodicity of a perpendicular segmentation of the at least one periodic structure;
determine a noise metric of at least one region of interest kernel based on the application of the first Fourier filter and the second Fourier filter; and
adjust one or more process control conditions based on the noise metric.

7. The system of claim 6, wherein the processor is configured to read the computer readable program to:
derive one or more statistical characteristics of residual noise; and
analyze one or more sources of target inaccuracy with the one or more statistical characteristics.

8. The system of claim 6, wherein the processor is configured to read the computer readable program to:
derive one or more additional target characteristics from a difference between a ID noise estimation and a 2D noise estimation, wherein:
the ID noise estimation is derived by application of one of the first or second Fourier filters; and,
the 2D noise estimation is derived by application of both of the first and second Fourier filters.

9. The system of claim 6, wherein the metrology target comprises:
an advanced imaging metrology (AIM) target.

10. The system of claim 6, wherein the metrology target comprises:
a box-in-box target.

* * * * *